United States Patent

Mannhart et al.

[11] Patent Number: 6,111,268
[45] Date of Patent: Aug. 29, 2000

[54] ELECTRONIC DEVICE

[75] Inventors: Jochen Mannhart, Leitershofen, Germany; Bernd Mayer, Adliswil, Switzerland

[73] Assignee: International Business Machines Corporartion, Armonk, N.Y.

[21] Appl. No.: 09/118,617

[22] Filed: Jul. 17, 1998

[51] Int. Cl.[7] .................. H01L 29/06; H01L 31/0256; H01L 39/22
[52] U.S. Cl. .................. 257/31; 257/34; 257/36; 257/39; 505/193
[58] Field of Search .................. 257/31, 32, 33, 257/34, 36, 39; 505/190, 193

[56] References Cited

U.S. PATENT DOCUMENTS

| | | | |
|---|---|---|---|
| 5,656,575 | 8/1997 | Mueller | 505/190 |
| 5,831,278 | 11/1998 | Berkowitz | 257/31 |
| 5,856,205 | 1/1999 | Kugai | 438/2 |
| 5,981,443 | 11/1999 | Wen | 505/329 |

FOREIGN PATENT DOCUMENTS 8-340134  12/1996  Japan .

*Primary Examiner*—Sara Crane

[57] ABSTRACT

The invention relates to an inverted JOFET with an at least bicrystalline electrically conductive substrate-layer bearing an insulating element and a superconductive element with a Josephson-junction. The substrate-layer is connected to a control-element. The invention further relates to a method for making such a JOFET. The grain boundary in the substrate-layer thereby maps into the Josephson-junction in the superconductive element.

11 Claims, 5 Drawing Sheets

(STATE OF THE ART)

(STATE OF THE ART)

ELECTRONIC DEVICE

TECHNICAL FIELD

The present invention relates to an electronic device, more particularly to a superconductive device with a Josephson-junction in a superconductive element.

Since the discovery of high-temperature superconductive materials by Bednorz and Müller superconductivity has been made available for a wide spectrum of applications, because of the simplified cooling mechanisms for higher device temperatures. As nowadays nearly every electronic circuit comprises at least one transistor and the demands made on these transistors concerning speed and power consumption rise day by day, researchers specialized on finding new designs of transistors coping with these demands. That's how superconductivity found its way into the field of transistors, providing them with low-loss. EP-A-0 324 044 describes a three terminal field effect device with a superconducting channel in which electric fields are used to control the transport properties of channel layers consisting of high-$T_c$-superconductive material.

BACKGROUND OF THE INVENTION

The publication "High-$T_c$ Transistors" by J. Mannhart in the Journal of Superconductor Science and Technology, Vol. 9, Nr. 2, page 49 ff, to be published on Feb. 1st 1996 gives an overview over the state of the art concerning so called "Three-terminal superconducting devices". These devices rely on superconductivity in a channel between a source- and a drain-electrode and show electronic properties in the superconducting state that surpass the device-relevant properties of semiconducting devices.

Depicted in the cited publication is a special representative of these devices which is the SUFET (SUperconducting Field-Effect Transistor). The SUFET consists of a substrate, a superconductive layer and an insulating layer, the insulating layer serving as gate insulator for a gate-electrode. Further a source- and a drain-electrode are fixed to the superconductive layer. The SUFET-device acts in a similar way as a known Field-Effect-Transistor (FET) which means that a voltage drop over an electrically conductive channel between source and drain can be controlled by a gate-voltage. In this device in particular the value of the Critical-Temperature $T_c$ of the superconductive layer is shifted up or down through the gate-voltage, dependent on the voltage's polarity. In the channel which in this case is superconductive, the distribution of the charge carriers plays an important role. Especially in a superconductor, where the density of the mobile charge carriers is very high in comparison with semiconductors, the effect called electrostatic shielding or screening, which means that the penetration-depth of the gate's electric field into the superconductor is limited because of a strong concentration change of the charge carriers at the superconductor/insulator-interface, causes problems. When electrostatic shielding occurs, the superconducting current in the channel can no longer be effectively controlled by raising the gate-voltage. This effect is delimiting the device's performance.

There have been made efforts to avoid this problem by using ultrathin superconductive layers which however then suffered from severe technological problems. To overcome this drawback in another way, the SUFET was modified to a JOFET (JOsephson Field-Effect Transistor). One type of JOFET consists also of a bicrystalline substrate, a superconductive layer and an insulating layer, the insulating layer serving again as gate insulator for a gate-electrode. In addition the JOFET is provided with a grain boundary protruding through the substrate as well as the superconducting layer and also the insulating layer. The grain boundary serves as a Josephson-junction in the superconductive layer, because there it represents a weak link, disturbing the superconductive behavior of the channel in a predetermined way. At the Josephson-junction the superconductive layer can be interpreted as being interrupted by a small gap of non-superconductive material. The underlying phenomena are the proximity-effect and the tunnel-effect which both have in common that a superconducting current can flow through this gap, when it is narrow enough. In this gap almost no free charge carriers exist and therefore the electrical field from the gate can penetrate much deeper into the gap than into the superconductive layer. The screening-effect is hence suppressed in the direct vicinity of the Josephson-junction. Further also the effective width of the gap can be controlled through the gate-voltage which amplifies the control effect of the gate-voltage. In summary, by the inserted Josephson-junction the negative effect of shielding is bypassed and a better control of the superconducting current is possible.

Due to the manufacturing principle the Josephson-junction in the above mentioned device as well as in the next mentioned device is called a "grain-boundary-induced Grain-boundary-Josephson-junction". In EP 0 329 603 A2 a method is described to produce a bicrystalline substrate with a bicrystalline superconductive layer upon it. This method was also used to manufacture the JOFET, by adding source- and drain-contacts and an insulating layer with a gate-contact on the superconductive layer.

Although this JOFET-device in theory offers an acceptable behavior, in reality a lot of problems occur which deteriorate the device's performance. A main problem is the fact that the superconductive layer which is a very sensitive crystal-layer, is strongly damaged by the gate manufacturing-process. During this process the stoichiometric ratio of the cations in the superconductive layer is deteriorated due to thermal diffusion. Particularly for the superconductive High-$T_c$ material $YBa_2Cu_3O_7$ the cations Y, Ba and Cu are diffusing away. Also a considerable amount of oxygen which is an important element in known high-$T_c$ superconductors, diffuses out of the superconductive layer. This diffusion lowers the Critical-Temperature $T_c$, making it thereby difficult to achieve a well-working device with an acceptable working-temperature. The gate manufacturing-process also normally uses a plasma for depositing the gate material. The plasma then introduces the drawback that also the superconductive layer's surface is bombarded with ions digging out elements of the superconductive layer and again distorting the stoichiometric ratio. Finally the often used oxygen-atmosphere has a pressure which changes the oxygen-portion of the superconductive layer. All these effects work together to deteriorate the quality of the superconductive layer. An effort is known to bypass these problems by depositing an amorphous insulating layer but this insulating layer showed worse dielectric properties like a low dielectric constant which again lead to very high gate-voltages needed to achieve a reasonable current control. Another problem is the fact that the grain boundary in the gate insulator acts as a leakage path for a gate current which impedes the application of required high gate-voltages. The publication "Field effect transistor based on a bi-crystal grain boundary Josephson-junction" by Ivanov et al. from the Applied Superconductivity Conference, Chicago, Ill., Aug. 23–28, 1992 describes such a JOFET and outlines the difficulties to obtain a viable device.

Efforts on this sort of device with a single grain boundary junction on a bicrystal substrate are also reported in "Electric Field Effect in $Sm_{1-x}Ca_xBa_2Cu_3O_y$ Bicrystal Junctions" by Dong et al. in IEEE Transactions on applied superconductivity, Vol. 5, No. 2, June 1995, pages 2879–2882, where the effect of overdoping a superconductor is examined and where the junction is treated with photolithography and ion milling. A floating gate is used to protect the superconductive layer while growing the gate but also this device shows a not outstanding superconducting current vs. gate-voltage characteristic.

In "Superconducting thin films for device applications" by D. F. Moore, 2nd Workshop on High Temperature Superconducting Electron devices, R&D Association for Future Electron Devices, Jun. 7–9, 1989, Shikabe, Hokkaido, Japan, pp. 281–284 it is reported that main thoughts are directed to thin film superconductors or to weak links to overcome screening. The described methods show the problems which occur during the manufacturing of the weak links, namely leakage problems or backscattering. To use electron beam exposure for producing the weak links is also mentioned but no results are given for this method.

In addition to the discussed JOFETs with a conventional FET-design another design is known:

From the research report "Large Electric Field Effects in $YBa_2Cu_3O_{7-\delta}$ Films Containing Weak Links" by Mannhart, Ströbel, Bednorz and Gerber in Applied Physics Letters No. 62, pages 630ff, 1992 is known a JOFET-device which comprises a Nb-doped $SrTiO_3$-electrically conductive substrate, a non-doped $SrTiO_3$-insulating layer and a $YBa_2Cu_3O_7$-superconductive-layer. The shown JOFET-device has again three terminals, namely a drain-, a source- and a gate-electrode. Whereas the source- and the drain-electrode are fixed as usual on the superconductive layer, the gate-electrode is now fixed on the substrate. The substrate itself is electrically conductive and therefore functions as a part of the gate-electrode. During the manufacturing-process the upper surface of the substrate is treated with a polishing-process whereby fine submicron grooves are produced in the substrate. The grooves serve as sources for the generation of crystal defects in the insulating layer which is manufactured during a following epitaxial process. The crystal defects in the insulating layer are themselves the sources for the generation of crystal defects in the superconductive layer which is produced also during an epitaxial process step. The crystal defects in the superconductive layer serve as weak links which in best cases show Josephson-junction-behavior. These weak links are, due to their manufacturing principle, called "groove-induced Grain-boundary-Josephson-junctions".

The advantage of this special design with the electrically conductive substrate and the gate-electrode on it, called "Inverted JOFET", is the fact that the superconductive layer is not inevitably deteriorated while manufacturing the gate-electrode as it happens with the non-inverted JOFET. However, here the problem is that the Josephson-junctions induced by the grooves show very bad properties, thereby reducing considerably the performance of the device.

In fact the resulting behavior is worse than the behavior of the known non-inverted JOFET. Another problem is the fact that, as a result of the polishing-process, not only one grain boundary but a network of several grain boundaries is produced which comprises more grain boundaries than wanted. Even worse, the grain boundaries are, due to the polishing principle, arranged in an unreproducable pattern. Thereby again no device with an acceptable Critical-Temperature $T_c$ has been achieved and also no acceptable superconducting behavior of the device. Another argument against this type of inverted JOFET-device is the fact that, starting from its design, multiple-gate-JOFETs can only be manufactured with a lot of work.

In "Electric Filed effects on $YBa_2Cu_3O_{7-\delta}$ Grain Boundary Josephson-junctions" by Nakajima et al. in the Japanese Journal of Applied Physics, Vol. 33 (1994), pp. L934–L937, Part 2, No. 7A, Jul. 1, 1994, a device is described which also uses the inverted design. However an electrically non-conductive substrate-layer is used as the gate insulator. The substrate is bicrystalline to produce the grain boundary in the superconductive element. To obtain an acceptable control the substrate is dimpled to a thickness of 40–50 μm. To operate this device still voltages around 80 V are needed. On the other hand a thinner substrate would lead to stability problems.

All in all High-$T_c$ FET devices have not yet evolved into viable devices, although many of them have been suggested. A figure of merit for a JOFET is its superconducting current $I_S$ vs. drain-source-voltage $U_{ds}$ characteristic which should have a high critical or maximum superconducting current $I_C$ and a high resistivity above the critical current $I_C$. In the following this is called a good superconducting behavior.

OBJECT AND ADVANTAGES OF THE INVENTION

It is therefore an object of the invention to deliver a JOFET which offers a high Critical-Temperature $T_c$ and shows an acceptable superconducting behavior.

The device according to the independent claim 1 shows the advantage that it comprises an exactly predetermined number of reproducible Josephson-junctions with exactly predetermined quality and position. This leads to the fact that the superconducting channel can be designed and dimensioned very precisely and hence the resulting device can function as a viable device working with acceptable working-conditions and providing a good superconductive behavior.

The subclaims of claim 1 show different measures which represent advantageous improvements and developments of the invention claimed in claim 1.

The fact that the substrate-layer is at least electrically surface-conductive is advantageous because the substrate then forms part of the gate-electrode whereby the distance between the gate-electrode and the superconductive element is decreased and the achievable control through the gate-voltage is improved.

Providing an electrically conductive element in and/or on an electrically non-conductive element of the substrate-layer brings the advantage that the substrate-layer can be made essentially of a cheap insulating material with only electrically conductive material where needed. The parasitic gate-capacity can thereby also be reduced in favor of a better device performance when the electrically conductive element is designed to have lesser portions in the vicinity of the drain-electrode and/or the source-electrode.

Positioning the electrically conductive element underneath the Josephson-junction alters the control effect through the gate-voltage and minimizes the parasitic gate-capacity.

To put together the substrate-crystals with a predetermined crystal-orientation means to exactly predetermine the structure of the resulting Josephson-junction and hence to choose the optimal orientation for best performance.

When the lattice constants between the substrate-layer and the insulating element are chosen to match, the crystal growth of the insulating element will be even more exact and the produced crystal defect will map into a similar defect in the insulating element.

The lattice match is relevant also for the superconductive element and the insulating element because it leads to an exactly defined crystal defect in the superconductive element and in the end to a Josephson-junction showing best junction characteristics.

Providing a magnetic-field-generating means creates the advantage that a second control input for the invented device is provided therewith which may be used as a fourth terminal.

It is particularly easy and cheap to provide such a magnetic-field-generating means directly on the invented device, for instance on the substrate-layer.

An intermediate-layer designed for enhancing the surface-quality of the substrate-layer can for example be helpful to increase the surface-conductivity between the substrate-layer and the insulating element and thereby improve the control achievable through the gate-voltage. It also can be used to improve the technological conditions while manufacturing device.

In the case when the insulating element is made of a ferroelectric material, the device can be used as a storage means because the ferroelectric material maintains its state of charge after shutting off the control-voltage.

It is a further object to provide a method for producing such a JOFET.

The method according to independent claim 12, due to the fact that the superconductive element is lying upon the insulating element and therefore is produced after the insulating element, maintains the high quality and precision of the superconductive element once it is grown and hence delivers a device which can function as a viable device working with acceptable working-conditions and providing a good superconductive behavior.

Another advantage arouses by fitting the crystals together in a predetermined orientation to get the optimal Josephson-junction structure.

To divide the substrate-layer up into a non-conductive element and an electrically conductive element is particularly advantageous because a cost-saving and mechanically stable material can be chosen for the non-conductive element and a more expensive material can still be chosen for the conductive element without making the whole device too expensive.

It is particularly advantageous to exchange the third and the fourth process-step because the superconductive layer is then produced as late as possible, thereby minimizing the likelihood of getting damaged.

SUMMARY OF THE INVENTION

The invented device is in principle an inverted JOFET with an at least bicrystal substrate. It has been found that surprisingly the drawbacks of grain boundary-induced Josephson-junctions can be overcome and that a device with better performance than a non-inverted JOFET with a grain boundary-induced Josephson-junction can be achieved. The invented method is suitable for delivering the invented device with a high-quality superconductive element, because the gate and its insulation-layer can be manufactured before the superconductive element.

DESCRIPTION OF THE DRAWINGS

Examples of the invention are depicted in the drawings and described in detail below by way of example. It is shown in FIG. 1: a cross-section of an inverted JOFET-device as known from the state of the art

All the figures are for sake of clarity not shown in real dimensions, nor are the relations between the dimensions shown in a realistic scale.

DETAILED DESCRIPTION OF THE INVENTION

In the following the various exemplary embodiments of the invention are described.

Figure 1:
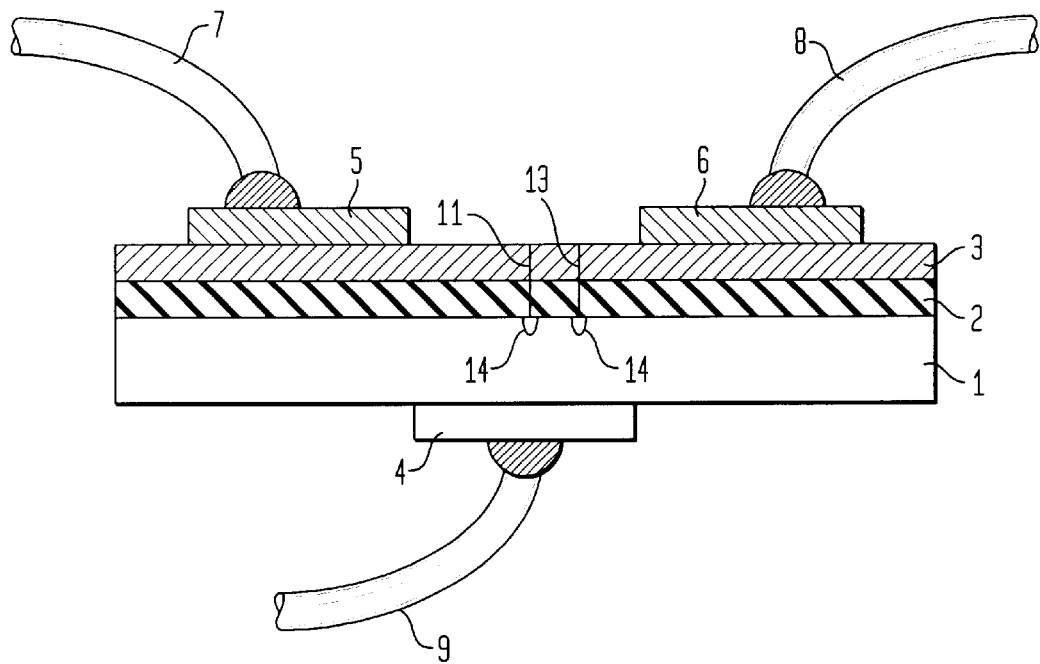

In FIG. 1 is shown a known inverted JOFET-device in a cross-sectional view with a flat substrate-layer 1 in whose upper surface are positioned two grooves 14. On the upper surface is arranged a flat insulating element 2 which is formed as an insulating layer. On the insulating layer 2 is again arranged a superconductive element 3 which is formed as a superconductive layer. Above each groove 14 a grain boundary is protruding through the insulating layer 2 and the superconductive layer 3. The sections of the two grain boundaries in the superconductive layer 3 form a first Josephson-junction 11 and a second Josephson-junction 13. On the lower surface of the substrate-layer 1 a control-element 4 is arranged underneath the grooves 14 viewed in a projection perpendicular to the surface of the substrate-layer 1. On the upper surface of the superconductive layer 3 are additionally arranged a first terminal 5 in form of a contact-element and a second terminal 6 in form of a contact-element, the contact-elements 5, 6 being positioned opposite to each other and the control-element 4 lying between them, viewed in a projection perpendicular to the surface of the substrate-layer 1. The control-element 4 is electrically conductively fixed to a first contact-wire 9. The first contact-element 5 is electrically conductively fixed to a second contact-wire 7. The second contact-element 6 is electrically conductively fixed to a third contact-wire 8. The control element 4 is also referred to as third contact-element 4.

The device is manufactured by supplying an electrically conductive substrate-material and bringing it into a flat, sheetlike form thereby providing the substrate-layer 1. Afterwards, a polishing step serves to produce the fine grooves 14 on the substrate-layer 1. The next step comprises the deposition of an insulating material, such as $SrTiO_3$ on the polished substrate-layer 1. Thereby the grooves 14 map into the grain boundaries in the resulting insulating layer 2 which hence is a polycrystalline-layer. Deposition can be accomplished by CVD, MBE or any other known deposition-method. Next, the superconductive element 3 is produced by carrying out several steps of crystal-growth whereby the grain boundaries in the insulating layer 2 again map into a mesh of grain boundaries in the superconductive element 3. Finally, metal pads are fixed to the superconductive element 3, e. g. by the known lift-off-method or by a known photolithography process using a photosensitive resin. Another metal pad is deposited on the electrically conductive substrate-layer 1. The metal pads serve as the contact-elements 4, 5, 6 and are contacted by the contact-wires 7, 8, 9 through bonding, soldering or the like.

The described structure is a JOFET which means that it works similarly to a normal Field-Effect-Transistor (FET), but has superconductivity as the principle for a low material-resistance and hence a loss-minimized current and has further a Josephson-junction 11, 13 to ensure effective control of the critical current, also called maximum superconducting current. The control-element 4 serves as gate-electrode, the first contact-element 5 as source-electrode and the second contact-element 6 as drain-electrode. The area of the superconductive element 3 between the source-electrode 5 and the drain-electrode 6 serves as channel. The potential-difference between the gate-electrode 4 and the channel is the driving force for the charge-carrier-accumulation at the interface between the superconductive element 3 and the insulating layer 2. The electric field applied to the superconductive element 3 namely changes the density of Cooper-pairs at this interface. This Cooper-pair density in the field-penetrated-layer within the superconductive element 3 is proportionally related to the resulting current in the channel. The Josephson-junctions 11, 13 take advantage of the proximity-effect which means that Cooper-pairs can tunnel through a non-superconductive barrier, in this case the Josephson-junction 11, 13, if the junction-width is small enough. The mechanism will be explained in more detail with respect to FIG. 3.

Figure 2:
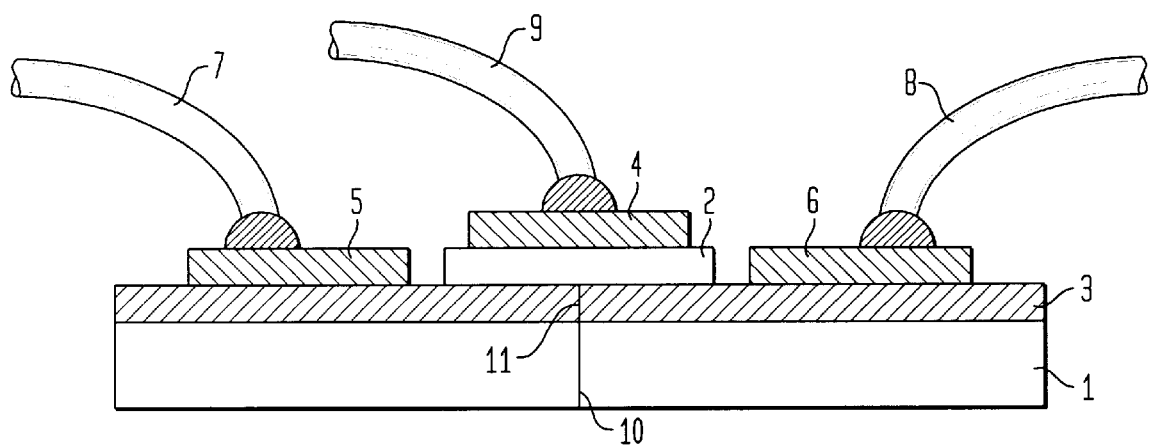
FIG. 2: a cross-section of a non-inverted JOFET-device as known from the state of the art

FIG. 2 shows the cross-section of a known non-inverted JOFET. The numbering is identical with the numbering of FIG. 1. The non-inverted JOFET differs from the inverted JOFET in the following details: The substrate-layer 1 is not monocrystalline but bicrystalline having a grain boundary separating the two substrate-crystals. The superconductive element 3 is attached directly to the substrate-layer 1 which is not electrically conductive. The insulating layer 2 lies now on the upper side of the superconductive element 3, between the drain-electrode 6 and the source-electrode 5, and is bearing the gate-electrode 4. This design is fairly well known from non-superconductive FET-designs.

After manufacturing the bicrystalline substrate-layer 1, the superconductive element 3 is grown on it. The insulating layer 2 is normally grown epitaxially by a thermal deposition technique with high temperatures. The control efficiency of the gate-voltage for this type of JOFET-device is higher than with the inverted type of JOFET-device, for the insulating layer 2 can be made much thinner. The problem is the high temperature during the growth of the insulating layer 2, because the oxygen, embedded in the crystalline structure of the superconductive element 3 then diffuses out. Plasma and the oxygen pressure further damage the superconductive element 3.

This design has been preferred by the skilled people because it up to now offers better properties than the inverted JOFET. Especially the Josephson-junction of this JOFET showed better behavior, so that development-efforts concentrated on this type. A further advantage is the possibility to provide multiple-gate devices and to use known processes from the semiconductor area.

Figure 3:
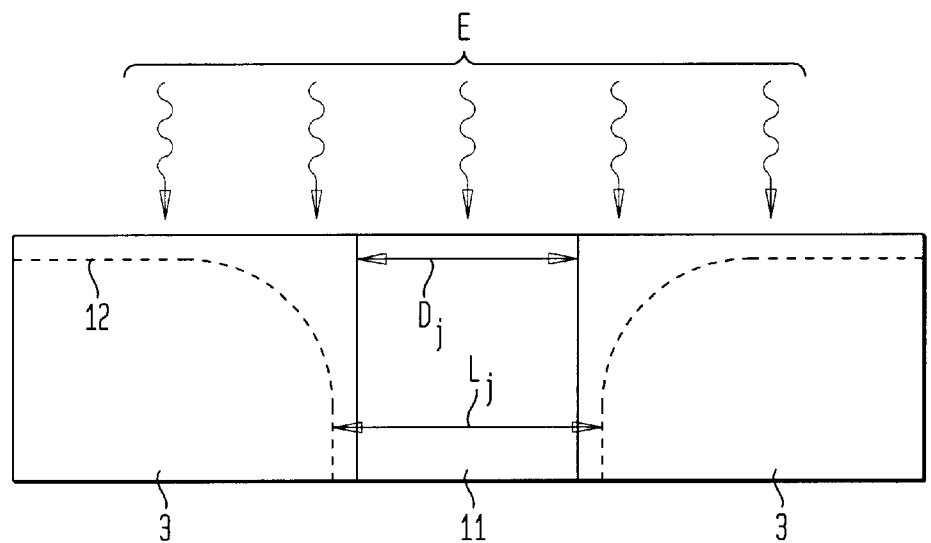
FIG. 3: a schematic oversized cross-sectional view of a Josephson-junction

In FIG. 3 is depicted a schematic view of a cross-section of the superconducting channel of a JOFET-device. The numbering from the previous figures has been kept. The two crystals of the superconductive element 3 are separated by the Josephson-junction 11. The Josephson-junction 11 has a nominal width $D_j$ which is delimited by the boundaries in the superconductive crystals here the superconductive property changes significantly adjacent to the grain boundary 10. A dotted line in each of the two crystals denominates the penetration-depth 12 of an electric field E, directed from the upper side of the crystals, deriving from the not depicted gate-electrode 4. Taking into account the penetration-depth 12, the Josephson-junction 11 has an effective width $L_j$, being the nominal width $D_j$ plus the penetration-depth 12 on each side of the gap formed by the Josephson-junction 11.

The electrical field E not only varies the current-bearing part of the channel but also the effective width $L_j$. As is known the effective width $L_j$ is decisive for the ability of the Cooper-pairs to tunnel across the Josephson-junction 11.

Figure 4:
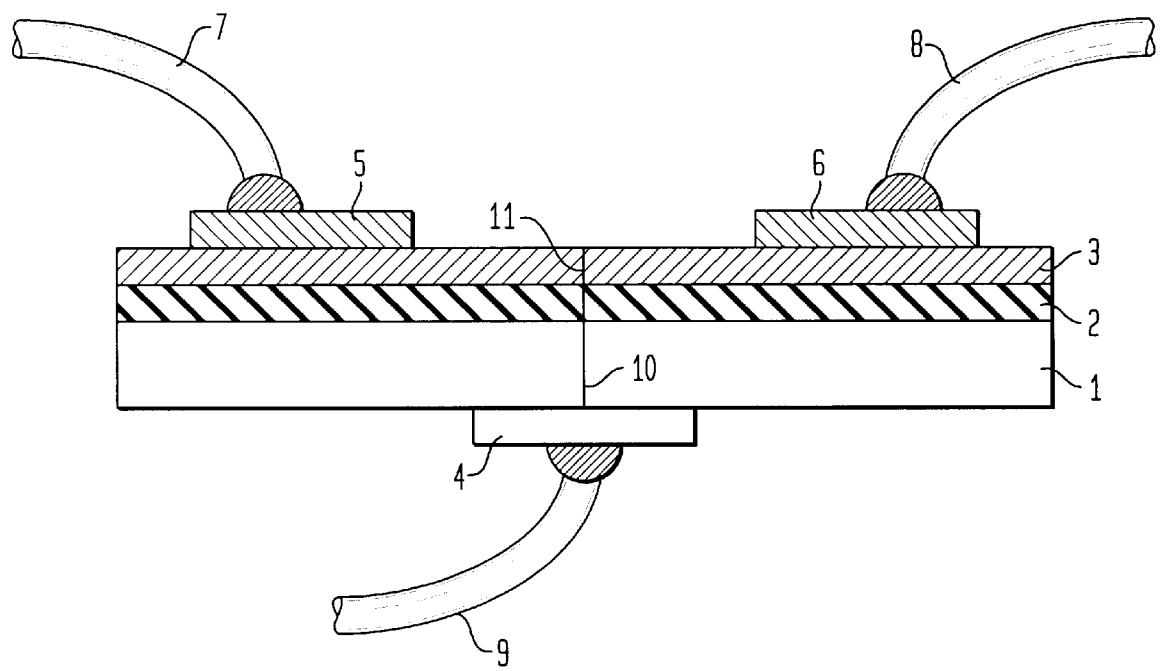
FIG. 4: a cross-section of a first embodiment of an invented JOFET-device

In FIG. 4 is depicted a cross-sectional view of a first exemplary embodiment of the invented device with three terminals. The figure uses essentially the same numbering as the FIGS. 1 and 2. The shown device shows the following differences to the device of FIG. 1: The substrate-layer 1 is bicrystalline, the two substrate-crystals being separated by a grain boundary 10. This grain boundary 10 is the source from which only one continuing grain boundary runs through the insulating layer 2 and the superconducting layer 3. Again the grain boundary 10 in the superconductive element 3 serves as the Josephson-junction 11, which in this device is the only weak-link in the superconducting channel. In a preferred embodiment the substrate-layer 1 consists of Nb-doped $SrTiO_3$, the insulating layer 2 of undoped $SrTiO_3$ and the superconductive element 3 of $YBa_2Cu_3O_7$. The contact-elements 4, 5, 6 can be made of a metal like gold or any other electrically conductive or even superconductive material.

The electrically conductive substrate-layer 1 functions as part of the gate-electrode 4. This means that the substrate-layer 1 does not contribute to the insulating layer 2 as insulator. Therefore the gate-voltage to be applied can be chosen smaller than with a device with an electrically non-conductive substrate-layer 1 which leads to a higher sensitivity. The gate-voltage leads to a depletion or an enhancement of charge-carriers in the superconductive channel depending on the polarity of the gate-voltage. Therewith the Critical temperature $T_c$ is shifted according to FIG. 5. Hence the device can be operated in an area between $T_c<T$ and $T_c>T$ serving as a switch. Further the device can be operated in the superconducting state only, varying the relation $T_c/T$ and thereby varying the maximum of the superconducting current.

The first advantage to the device of FIG. 1 is that the Josephson-junction 11 is the only one and not one of several junctions meshed in a network. This results in an exactly reproducible and therefore optimizable structure for the channel. Further the angle, position and crystal direction parameters of the Josephson-junction 11 can be defined easily and exactly by doing this with the substrate-layer 1.

The second advantage is that the grain-boundary-induction allows the Josephson-junction 11 to grow in a different way in comparison with a groove-induced junction. The resulting grain-boundary-induced Josephson-junction 11 shows much better properties than the groove-induced junctions do.

It is advantageous to choose in general materials whose lattice-constants match. This is particularly important for the substrate-layer 1, the insulating element 2 and the superconductive element 3 because the lattice-match leads to a precise mapping of the grain boundary 10 in the substrate-layer 1 into the grain boundary 10 in the superconductive element 3. The more precise the mapping is, the more controllable and predictable is the behavior of the Josephson-junction 11.

The invented device is manufactured in that a monocrystalline electrically Nb-doped $SrTiO_3$ substrate block is separated into two substrate-crystals which are put together again after determining the grain boundary's angle, position and crystal-direction and polishing the opposite surfaces. The separation can for instance be done mechanically with a saw. Afterwards the insulating layer 2 is grown epitaxially and may consist of undoped $SrTiO_3$, having a lattice whose constant matches the lattice-constant of Nb-doped $SrTiO_3$. Then the critical process-step of manufacturing the insulating layer 2 follows with process-conditions that are relatively aggressive, but necessary to achieve a high quality of the insulating layer 2. The gate-electrode 4 is then grown with a temperature which is not able to damage a superconductor such as the room-temperature 20° C. The following epitaxial step is used to grow the superconducting layer 3, for instance a Cuprate like $YBa_2Cu_3O_7$, to mention the most popular type. The drain-electrode 6 and the source-electrode 5 are grown with the same process-conditions as the gate-electrode 4, hence with a non-problematic temperature. The electrodes 4, 5, 6 can be made of gold, silver, copper etc. Whereas keeping the order of manufacturing the superconductive layer 3 after the insulating layer 2 is very important, the order concerning the electrodes 4, 5, 6 is relatively uncritical because of the non-aggressive process-conditions for this. Because the insulating layer 2 is not grown on the superconductive element 3, no high temperatures have to be applied, once the superconductive element 3 exists and hence the superconductive element 3 is not damaged during the device-manufacturing-process.

Figure 5:
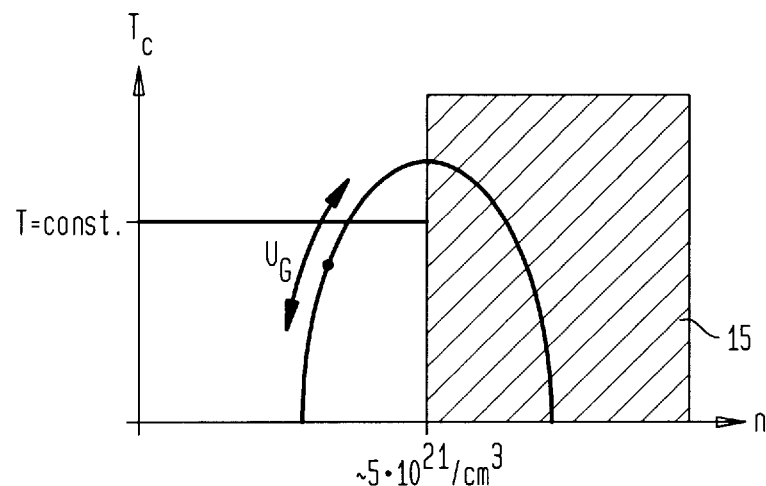
FIG. 5: a qualitative diagram of the $T_C$-control by the gate-voltage $U_G$

FIG. 5 shows a schematic diagram for the control of the charge-density in the channel by the gate-voltage $U_G$ and therefore of the Critical-Temperature $T_C$. The scale is only to be seen qualitatively, not quantitatively. The horizontal axis counts the number n of free charge-carriers. The relation between the Critical-Temperature $T_C$ and the number n of free charge-carriers is quadratic and hence gives a parabolic curve. The area where the number n of free charge-carriers decreases with falling Critical-Temperature $T_C$ is a not accessible area 15 with practical real devices.

Keeping the device's temperature at a constant level T=const. the device can be used as a switch, the on-state being the region when $T_C$ is higher than T, the off-state being the region when $T_C$ is lower than T.

Figure 6:
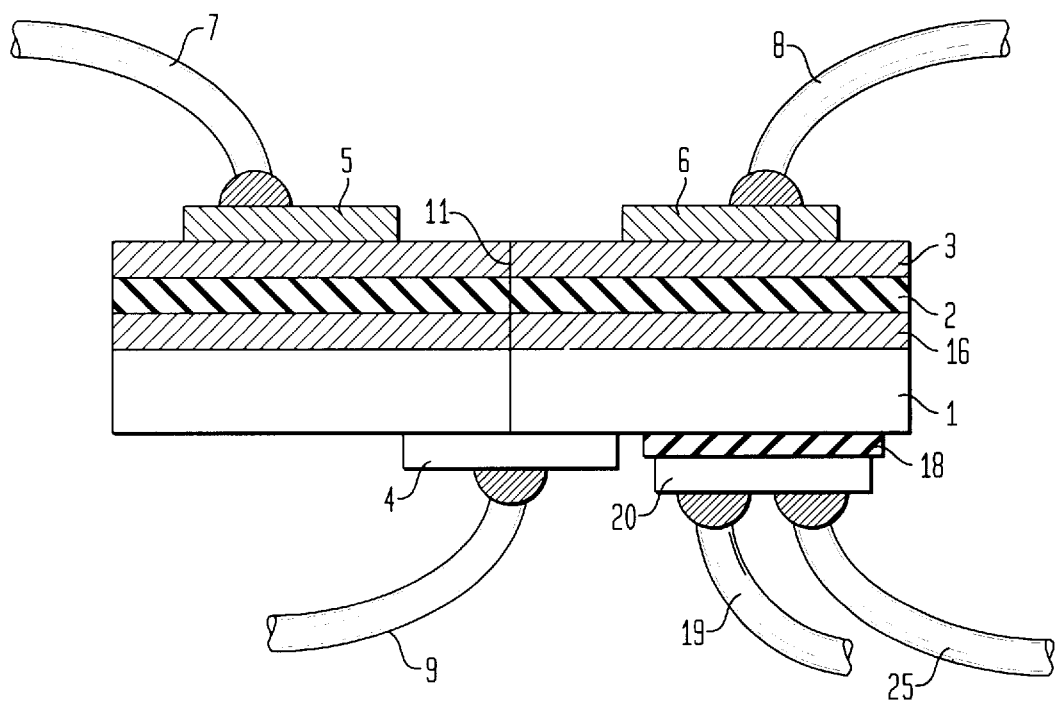
FIG. 6: a cross-section of a second embodiment of an invented JOFET-device

In FIG. 6 is shown another embodiment of the invention in cross-sectional view. The embodiment uses the same numbering as in FIG. 4 but with the following differences: Additionally an intermediate-layer 17 is provided serving as a sort of conductivity-bridge. The intermediate-layer 17 can for instance be made of platinum. Further an electrically conductive conductor-element 20 is fixed to the substrate-layer 1 using an intermediate insulating pad 18. The electrically conductive conductor-element 20 is connected with a fourth contact-wire 19 and a fifth contact wire 25. Thus the device is modified to a five-terminal device.

The intermediate-layer 17 serves for example as a supplementary means for achieving a better surface conductivity, because it has been found that some substrate materials being electrically conductive per se, are not electrically surface conductive. The intermediate-layer 17 shall be of a material that provides this wanted surface-conductivity, particularly by diffusing into the substrate-layer 1 as well as the insulating layer 2. Another property of the intermediate-layer 17 is the possibility to achieve better manufacturing conditions with the choice of a suited material for the intermediate-layer 17. For instance the intermediate-layer 17 can be chosen to protect the substrate-layer 1 of a rough process-atmosphere which is chosen best suitable for depositing the insulating layer 2. Or the intermediate-layer 17 serves for rendering the surface of the substrate-layer 1 particularly attractive for the material of the insulating layer 2. This is no complete enumeration but many other achievable advantages, not mentioned here, of such an intermediate-layer 17 can be found. The electrically conductive conductor-element 20 is to be used to conduct an electrical current near the Josephson-junction 11 to provide a magnetic field. As is known, a magnetic field influences the behavior of the Josephson-junction 11 concerning its superconductivity. The current flowing through the electrically conductive element 20 is hence usable as another control means for the superconducting current.

Figure 7:
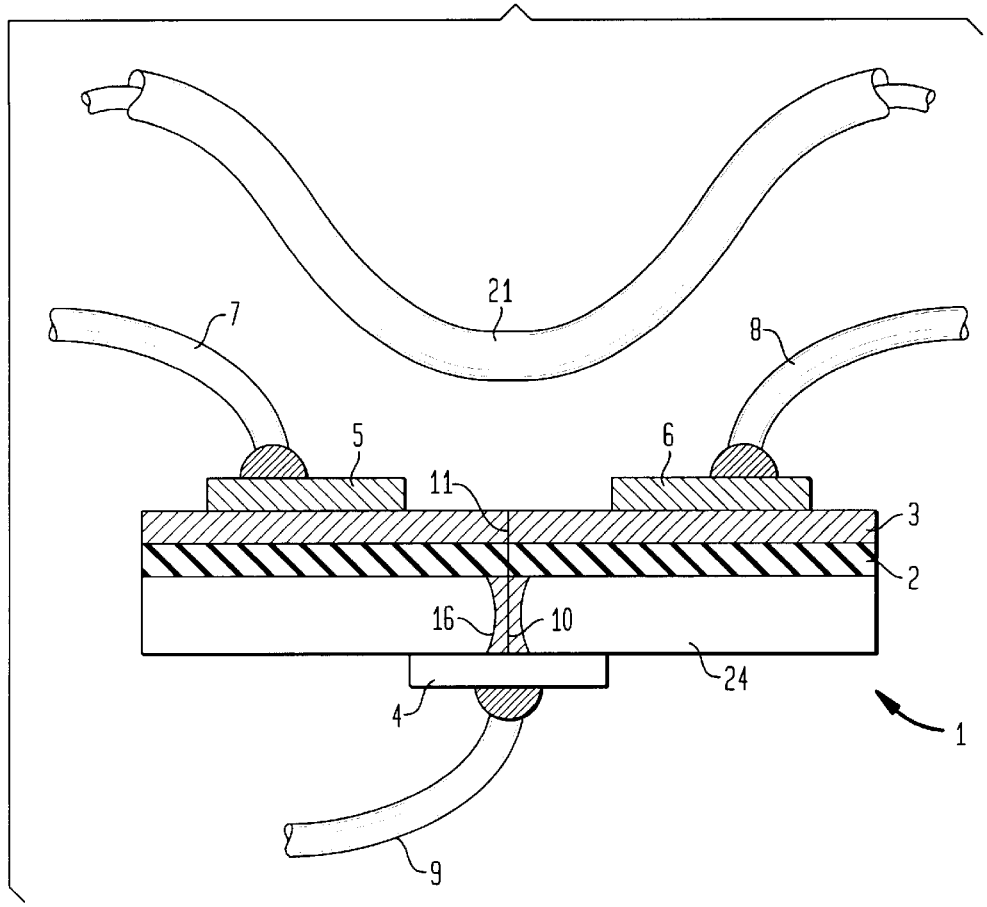
FIG. 7: a cross-section of a third embodiment of an invented JOFET-device

FIG. 7 shows a cross-section of an embodiment of the invention which is another modification of the device shown in FIG. 4. In contrary to FIG. 4 here the substrate-layer 1 comprises an insulating element 24 and an electrically conductive element 16. The electrically conductive element 16 is designed as a bung-like formed path of conductive material surrounded by the insulating element 24. The electrically conductive element 16 is arranged right over the gate-electrode 4 and underneath the Josephson-junction 11. Further there is a cable 21 running near by the device in the vicinity of the Josephson-junction 11.

The production of the electrically conductive element 16 can require more energy and effort but results in better performance, because the parasitic gate-capacity is reduced and a plurality of electrical elements having the single substrate-layer 1 in common are decoupled. In this way multiple-gate-devices can be achieved. An example for such a method of achieving restricted conductivity is ion beam doping. The cable 21 has the same function as the electrically conductive conductor-element 20 from FIG. 6, i. e. producing a magnetic field penetrating the Josephson-junction 11, thereby influencing its electrically conductive properties.

Figure 8:
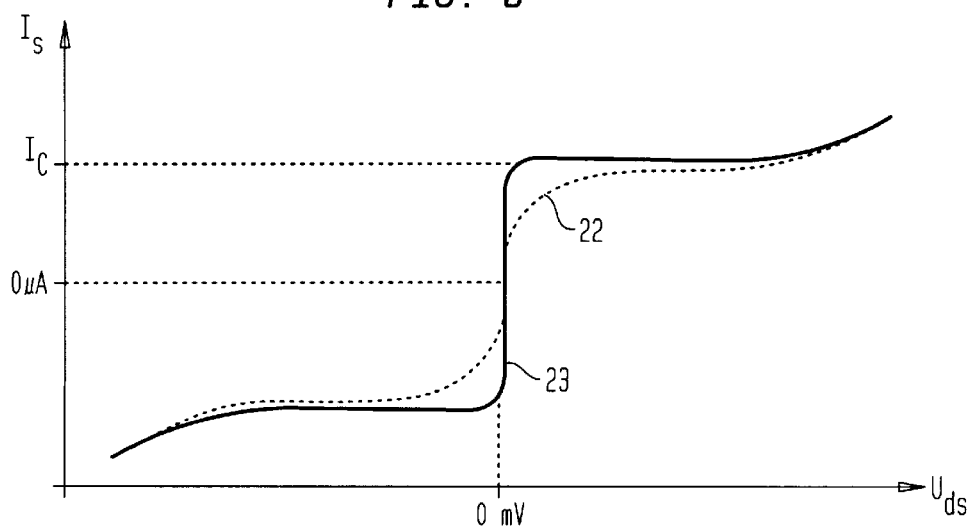
FIG. 8: a qualitative diagram of the superconducting current $I_S$ versus the drain-source-voltage $U_{ds}$

FIG. 8 shows a qualitative diagram with the drain-source-voltage $U_{ds}$ as horizontal axis and the superconducting current $I_S$ in the superconductive channel as vertical axis. A dotted line 22 shows the function $I_S(U_{ds})$ for a known JOFET with inverted design and groove-induced Grain-boundary-Josephson-junctions 11, 13, like the JOFET shown in FIG. 1. A solid line 23 shows in comparison the same function for a JOFET with inverted design according to the invention, hence with the grain-boundary-induced Grain-boundary-Josephson-junction 11.

As can be clearly seen, the solid line 23 around the point of $U_{ds}$=0 mV is much steeper than the dotted line 22. Therefore the superconducting current $I_S$ increases more rapidly with the rising drain-source-voltage $U_{ds}$ for the invented device. This shows that the invented device offers a smaller resistance for higher superconducting currents $I_S$ than the known device. In fact this behavior is the one predicted for all JOFETs in theory but has not been achieved in practice until now. Because of this bad behavior the known devices have not been found acceptable and hence not been used. The sharp edge of the function when the curve's pitch changes to an almost horizontal course, is the point when the maximum superconducting current $I_C$ is reached. This maximum superconducting current $I_C$ is a natural limit which depends on the device's dimensions and geometry. By changing the gate-voltage $U_G$ this maximum superconducting current $I_C$ can be varied.

Figure 9:
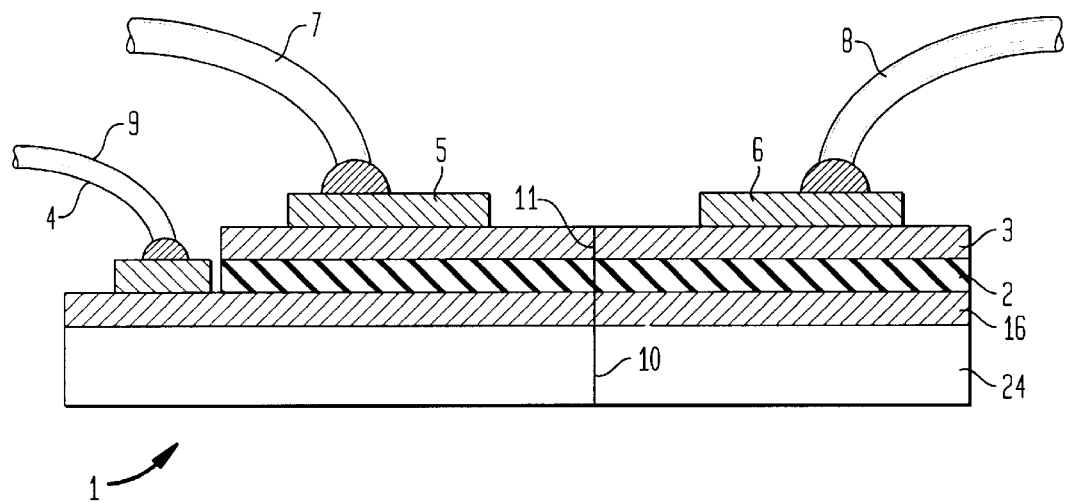
FIG. 9: a cross-section of a fourth embodiment of an invented JOFET-device
Figure 10:
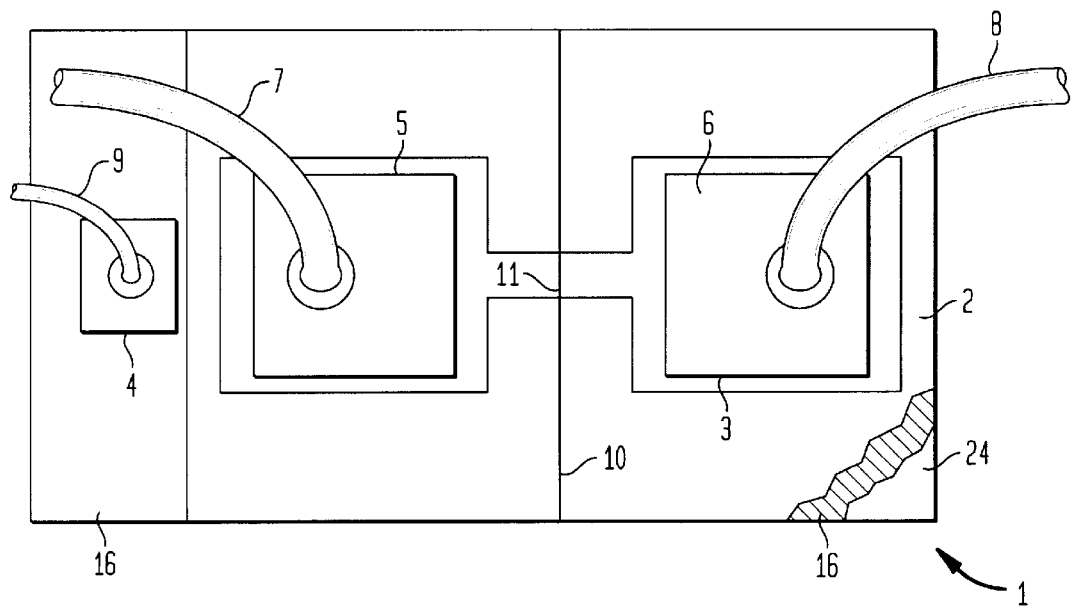
FIG. 10: a top view of the embodiment of FIG. 9

FIG. 9 and FIG. 10 depict another embodiment of the invention which in principle has the elements of the embodiment of FIG. 7 but shows the following differences compared with it: The electrically conductive element 16 is not embedded in the insulating element 24 but is designed as an electrically conductive element 16 which is deposited on the insulating element 24 which itself has a sheetlike form. The whole substrate-layer 1 has a bigger horizontal dimension than the insulating layer 2 and the superconductive element 3. The gate-electrode 4 is not fixed to the lower side of the substrate-layer 1 but to the upper side to make contact to the electrically conductive element 16 which thereby forms part of the gate-electrode 4. Further the superconductive element 3 is not a whole-layer but has been patterned during the manufacturing-process to finally consist of two rectangular areas connected by a narrow, elongated bridge through which the grain boundary 10 runs, thereby forming the Josephson-junction 11.

This embodiment has the advantage that a cheap insulating substrate material can be used to gain the needed mechanical stability of the device, whereas the more expensive material for the electrically conductive element 16 must only be provided to cover the surface of the insulating element 16. Nevertheless the whole manufacturing-process for this device can be chosen as a layerwise process, hence taking advantage from the well known and mastered thin-film-technology. The superconductive element 3 can of course be designed in different other forms, e.g. with a meander-like bridge which can be arranged in a way that the grain boundary 10 penetrates the bridge several times, each time thereby forming a new Josephson-junction 11. By this design the only one grain boundary 10 provides a plurality of Josephson-junctions 11. Of course also several grain boundaries 10 can be provided in the device. Also the form of the insulating layer 2 is not delimited to the shown example but can be varied according to different needs.

The device of FIGS. 9 and 10 can be manufactured by using known processes, such as epitaxial deposition and photolithographic methods.

All the shown embodiments of the invention can be varied concerning dimensions, materials and forms of the various elements. The shown embodiments can also be combined in part or as a whole. The same is valid for the methods to produce the invented devices. Whereas it is most advantageous to manufacture the superconductive element 3 as late as possible, nevertheless the several manufacturing steps can be carried out in a different order or even simultaneously.

The device can be used especially in SQUIDs (Superconducting QUantum Interference Devices).

What is claimed is:

1. Electronic device comprising an insulating element on a substrate-layer, said insulating element bearing a superconductive element, further comprising at least one control-element fixed to said substrate-layer and at least one Josephson-junction in said superconductive element positioned above said control-element characterized in that at least one grain-boundary is provided, separating said substrate-layer into at least two substrate-crystals, and separating said insulating element into at least two insulator-crystals, said grain-boundary forming said Josephson-junction.

2. Electronic device according to claim 1, characterized in that the substrate-layer is at least electrically surface-conductive.

3. Electronic device according to claim 1, characterized in that the substrate-layer is made of an insulating material comprising at least one electrically conductive element.

4. Electronic device according to claim 3, characterized in that the electrically conductive element is arranged below the Josephson-junction.

5. Electronic device according to one of claims 1 to 4, characterized in that the substrate-crystals are meeting each other with a predetermined crystal-orientation at the grain boundary.

6. Electronic device according to one of claims 1 to 5, characterized in that the lattice constants of the substrate-layer and of the insulating element at least approximately match.

7. Electronic device according to one of claims 1 to 6, characterized in that the lattice constants of the superconductive element and of the insulating element at least approximately match.

8. Electronic device according to one of claims 1 to 7, characterized in that a magnetic-field-generating means is provided in the vicinity of the Josephson-junction.

9. Electronic device according to claim 8, characterized in that the magnetic-field-generating means comprises an electrically conductive conductor-element fixed to the device, in particular to the substrate-layer.

10. Electronic device according to one of claims 1 to 9, characterized in that an intermediate-layer is arranged between the substrate-layer and the insulating element, said intermediate-layer enhancing the surface-quality of said substrate-layer.

11. Electronic device according to one of claims 1 to 10, characterized in that the insulating element is made of a ferroelectric material.

* * * * *